US009192069B2

(12) United States Patent
Emert et al.

(10) Patent No.: US 9,192,069 B2
(45) Date of Patent: Nov. 17, 2015

(54) MODULAR POWER SKID ASSEMBLED WITH DIFFERENT ELECTRICAL CABINETS AND COMPONENTS MOUNTED ON THE SKID

(71) Applicant: Rosendin Electric, Inc., San Jose, CA (US)

(72) Inventors: Steve Emert, Hayward, CA (US); John Manual Loera, San Jose, CA (US)

(73) Assignee: Rosendin Electric, Inc., San Jose, CA (US)

( * ) Notice: Subject to any disclaimer, the term of this patent is extended or adjusted under 35 U.S.C. 154(b) by 267 days.

(21) Appl. No.: 13/959,629

(22) Filed: Aug. 5, 2013

(65) Prior Publication Data

US 2015/0036266 A1    Feb. 5, 2015

(51) Int. Cl.
| H02B 1/00 | (2006.01) |
| H05K 7/02 | (2006.01) |
| H05K 7/20 | (2006.01) |
| H02B 1/30 | (2006.01) |
| H02B 1/20 | (2006.01) |

(52) U.S. Cl.
CPC ............. *H05K 7/026* (2013.01); *H05K 7/20* (2013.01); *H02B 1/20* (2013.01); *H02B 1/30* (2013.01)

(58) Field of Classification Search
None
See application file for complete search history.

(56) References Cited

U.S. PATENT DOCUMENTS

| 7,278,273 | B1 * | 10/2007 | Whitted et al. | 62/259.2 |
| 7,511,959 | B2 * | 3/2009 | Belady et al. | 361/701 |
| 8,681,479 | B2 * | 3/2014 | Englert et al. | 361/600 |
| 2005/0068716 | A1 * | 3/2005 | Pereira | 361/624 |
| 2015/0036254 | A1 * | 2/2015 | Emert et al. | 361/93.1 |

* cited by examiner

*Primary Examiner* — Gregory Thompson
(74) *Attorney, Agent, or Firm* — Rutan & Tucker, LLP

(57) ABSTRACT

An integrated platform assembled with different electrical cabinets and components mounted on a framework in order to provide a complete datacenter critical power distribution package. The integrated platform supports the weight of cabinet enclosures and UPSs mounted onto a skeletal framework, which acts as an equipment support structure and a cable routing support system. Main and redundant power supply wiring is routed along the skeletal framework to and between the cabinet enclosures and the UPSs mounted thereon. Electrical connections between the cabinets are internally connected via bus bars as switchgear cabinets. The skeletal framework has top and bottom rails run substantially parallel to each other with cross bars connecting the top and bottom rails and a top horizontal surface to which one or more of the cabinet enclosures are mounted. The skeletal framework and cabinet enclosures are fabricated prior to installation and installed as a monolithic pre-wired pre-assembled integrated platform.

20 Claims, 10 Drawing Sheets

```
                    ( Cont. )
                       |
                       v
```

The bypass control circuitry allows selection of an external AC power source directly to the electrical distribution system; and thus, bypassing the main and back up uninterruptible power supplies while still supplying AC power to the electrical distribution system via electrically closing the maintenance bypass breaker and opening the first and the second electrically parallel breakers.
520

An output of critical power from the uninterruptible power supplies is coupled to the power distribution output panel for datacenter loads, via at least the maintenance bypass breaker, where a Solenoid Key Release Unit (SKRU) is configured to ensure that the main uninterruptible power supply has transferred to bypass before the maintenance bypass breaker can be engaged to the power
522                     distribution output panel The integrated platform provides up to 1200 KW in critical power from the main and backup UPSs in a floor space footprint of less than 470 square feet, which results in open space to lease in a datacenter, and the series of electrical cabinets each contain circuit breakers within a given electrical amperage rating range; and thus, many circuit breakers of similar average electrical amperage ratings are contained within the same cabinet and a neighboring cabinet has circuit breakers
524           of a different range of electrical amperage One of the cabinets contains circuit breakers for mechanical cooling power loads for a data center, and another cabinet contains circuit breakers for computing
526                equipment loads for the data center.

A weight of the integrated platform including the mounted cabinet enclosures and the skeletal framework is heavy enough by itself to be structurally sound and not require to be anchored to either a construction foundation or to a building's foundation in non-seismic zones, and the switchgear cabinets mechanically and electrically interconnect via the electrical bus bars through the sides of the cabinets to form the switchgear cabinet rather than connecting between the cabinets with electrical conduits and wires routed underneath each cabinet.
528

Figure 7C        ( End )

MODULAR POWER SKID ASSEMBLED WITH DIFFERENT ELECTRICAL CABINETS AND COMPONENTS MOUNTED ON THE SKID

FIELD OF THE INVENTION

Embodiments of the invention generally relate to a critical power distribution system.

More particularly, an aspect of an embodiment of the invention relates to a critical power distribution system on a modular power skid with different electrical cabinets and components, including a built-in uninterruptible power supply, in order to provide a complete datacenter critical power distribution package.

BACKGROUND OF THE INVENTION

The term modular has been used to describe a variety of approaches to datacenter design. An initial commercially available modular design was a Sun Microsystems' container-based product called the Black Box. Today, the term describes products that range from shipping containers and simple repeated designs to fully manufactured IT spaces and mechanical, electrical, and plumbing systems built in factories and shipped to various sites. However, current shipping containers, on their own, lack the ability to create a truly interconnected facility and do not withstand weather very well.

SUMMARY OF THE INVENTION

Methods and apparatuses for a monolithic, pre-wired, pre-assembled, and pre-engineered integrated platform for a critical power supply and electrical distribution system that is pre-assembled, scalable, and modular are discussed. The integrated platform includes a skeletal framework that acts as an equipment support and a cable routing support system. The integrated platform supports the weight of two or more cabinet enclosures and two or more uninterruptible power supplies (UPSs) mounted onto the skeletal framework. The cabinet enclosures include at least a main power supply input breaker housed in a first cabinet enclosure mounted to the skeletal framework and a power distribution output panel, housed in a second cabinet enclosure mounted to the skeletal framework, to supply power to electrical loads. Main and backup critical power supply wiring can be laid out and routed along the skeletal framework of the integrated platform to and between at least one of the two or more of the cabinet enclosures mounted onto the skeletal framework and the two or more UPSs mounted onto the skeletal framework. Electrical connections between the two or more cabinets may be internally connected via bus bars as switchgear cabinets. The skeletal framework of the integrated platform has top and bottom rails run substantially parallel to each other with cross bars connecting the top and bottom rails to form the skeletal framework of the integrated platform. The skeletal framework has a top horizontal surface to which one or more of the cabinet enclosures is mounted. The skeletal framework and the cabinet enclosures are fabricated in place prior to the integrated platform being installed as a monolithic, pre-wired, pre-assembled integrated platform.

Another embodiment provides a static switch included in a main UPS in a third cabinet enclosure. A backup UPS housed in a fourth cabinet enclosure is mounted back to back with the main UPS in the third cabinet enclosure. The main and backup UPSs are electrically connected in parallel. The static switch cabinet contains electrical equipment to ensure instantaneous switchover from one UPS to the other in the event of a power failure. The third cabinet contains a maintenance bypass switch for power when both the main UPS and the backup UPS are electrically isolated from the electrical loads connected to the power distribution output cabinet mounted on the framework of the skid.

Another embodiment provides that the main UPS and the backup UPS are both transistor-based, as opposed to silicon controlled rectifier-based, and have no transformer on their output.

BRIEF DESCRIPTION OF THE DRAWINGS

The drawings refer to embodiments of the invention in which:

FIGS. 7A-C illustrate a flow diagram of an embodiment of constructing and operating an embodiment of an integrated platform assembled with different electrical cabinets and components mounted on the framework of the integrated platform in order to provide a complete datacenter critical-power distribution package.

Figure 1:
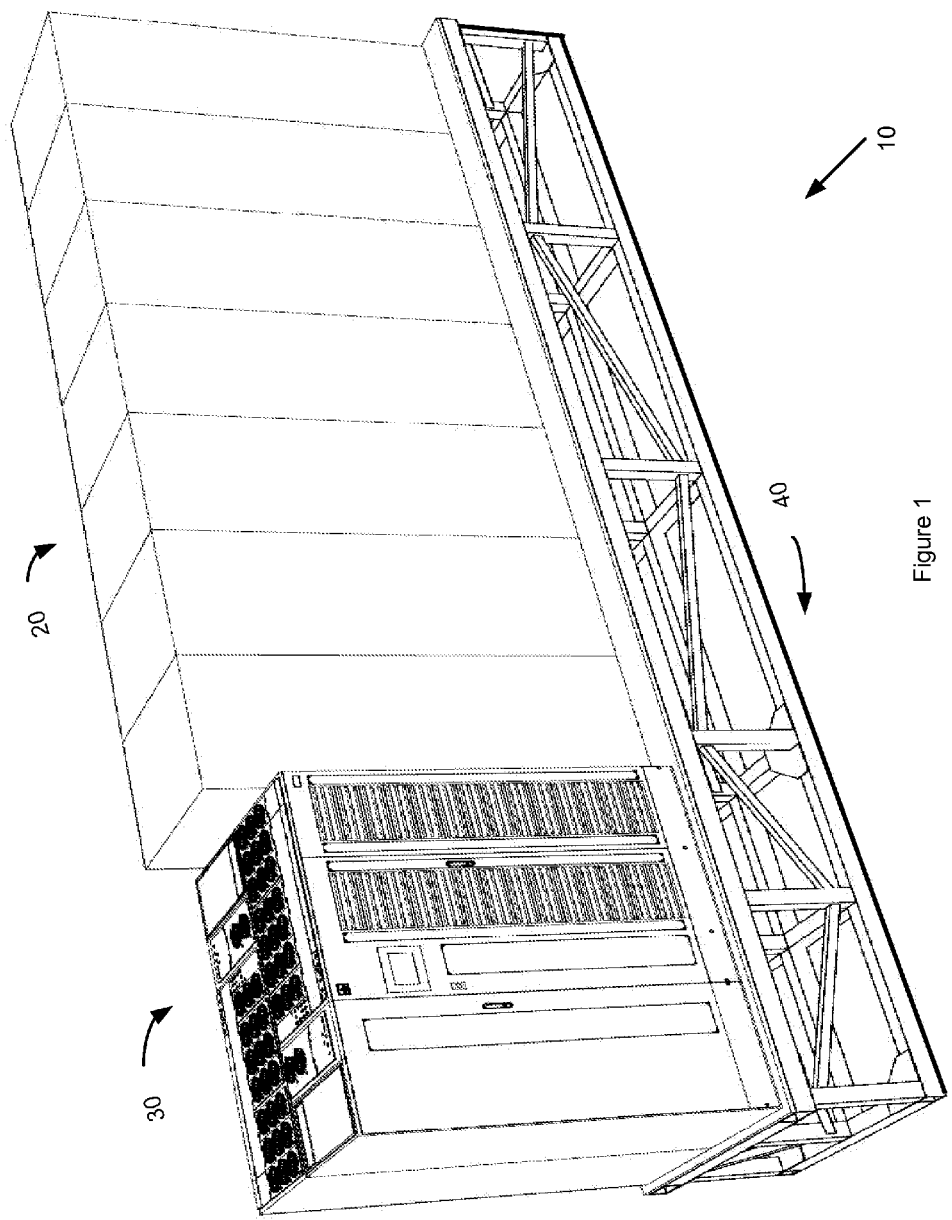
FIG. 1 illustrates a front view of an embodiment of pre-wired and pre-engineered integrated platform for power supply and distribution that has two or more cabinet enclosures and two or more uninterruptible power supplies mounted onto the skeletal framework.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of circuit breakers in a cabinet, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references, such as first cabinet, may be made. However, the specific numeric reference should not be interpreted as a literal sequential order but rather interpreted as a first cabinet is different than a second cabinet. Thus, the specific details set forth are merely exemplary. The specific details may be varied from and still be contemplated to be within the spirit and scope of the present invention. The term coupled is defined as meaning connected either directly to the component or indirectly to the component through another component.

In general, disclosed herein are various methods and apparatuses associated with a pre-wired and pre-engineered integrated platform for power supply and distribution that is pre-assembled, scalable, and modular. The skeletal framework and the cabinet enclosures are fabricated in place prior to the integrated platform being installed as a monolithic, pre-wired, pre-assembled integrated platform.

FIG. 1 illustrates a front view of an embodiment of pre-wired and pre-engineered integrated platform for power supply and distribution that has two or more cabinet enclosures and two or more UPSs mounted onto the skeletal framework. The skeletal framework 40 and the cabinet enclosures 20 are fabricated in place prior to the integrated platform 10 being installed on site and all of the components are installed as a monolithic, pre-wired, pre-assembled integrated platform 10.

The pre-wired and pre-engineered integrated platform 10 has a skeletal framework 40 that acts as an equipment support structure as well as a cable routing support system. The skeletal framework 40 supports the weight of two or more cabinet enclosures 20 and two or more UPSs 30 mounted onto the skeletal framework 40. The two or more cabinet enclosures 20 at least include 1) a main power supply input breaker housed in a first cabinet enclosure mounted to the skeletal framework and 2) a power distribution output panel housed in a second cabinet enclosure mounted to the skeletal framework to supply to power electrical loads. Main and backup power supply wiring is laid out and routed along at least a portion of the skeletal framework 40 of the integrated platform 10 to and between at least one of the two or more of the cabinet enclosures 20 mounted onto the skeletal framework 40. Electrical connections between the two or more cabinet enclosures 20 may be internally connected via bus bars as switchgear cabinets.

The skeletal framework 40 of the integrated platform 10 has top and bottom rails run substantially parallel to each other with diagonal cross bars connecting the top and bottom rails to form the skeletal framework 40 of the integrated platform 10. Some irregular patterned horizontal surfaces and structures may be formed into the rails on top of the framework to better facilitate mounting the cabinets and UPSs. The skeletal framework 40 has a top horizontal surface to which one or more of the cabinet enclosures 20 mount to the above-mentioned rails.

The uninterruptible power supply (UPS) cabinets 30 are mounted in a back to back arrangement for the main UPS in the third cabinet enclosure and the backup UPS in the fourth cabinet. The UPSs cabinets 30 are mounted on the skeletal framework 40.

Figure 2:
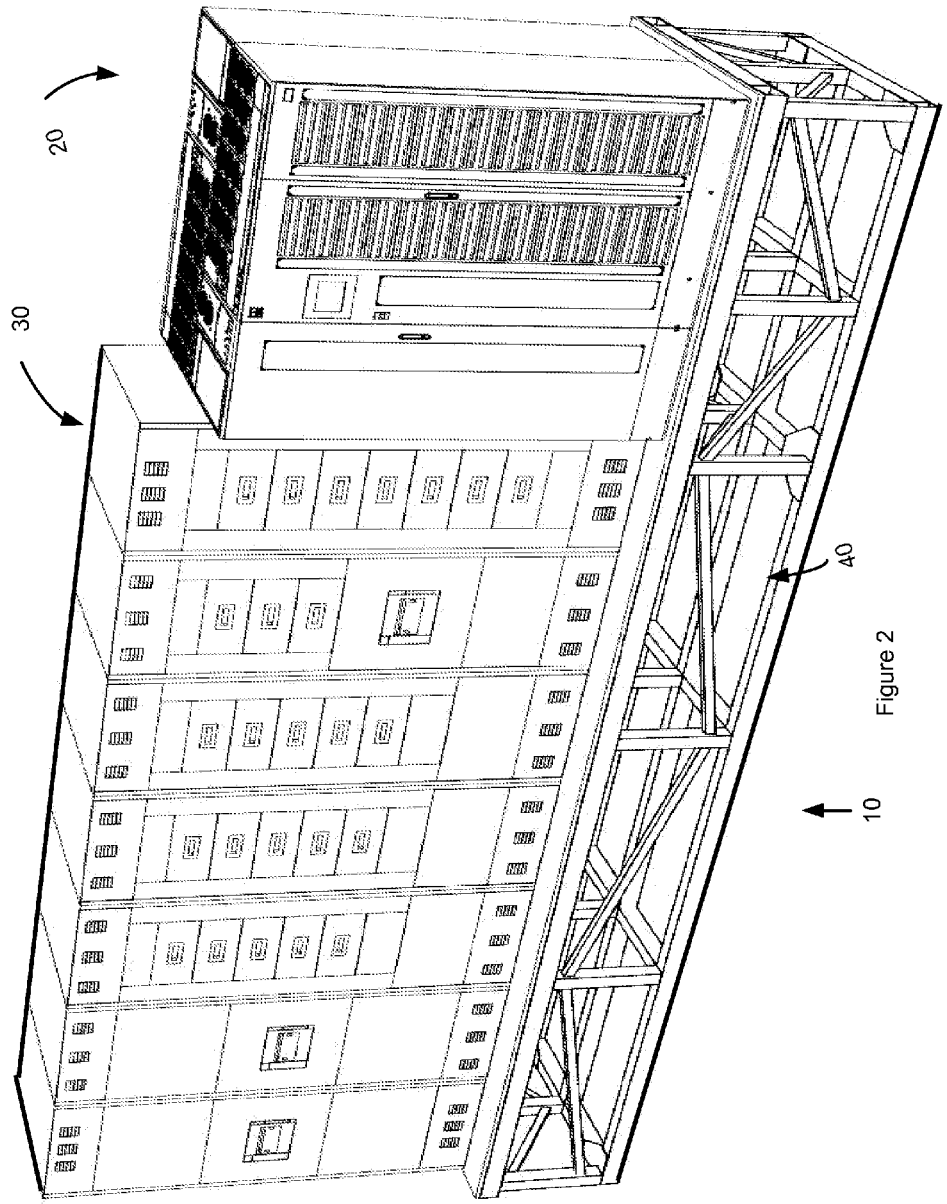
FIG. 2 illustrates a rear view of an embodiment of the pre-wired and pre-engineered integrated platform where its skeletal framework acts as an equipment support structure as well as a cable routing support system.

FIG. 2 illustrates a rear view of an embodiment of the pre-wired and pre-engineered integrated platform 10 where the skeletal framework 40 acts as an equipment support structure as well as a cable routing support system. Another embodiment provides that each cabinet enclosure 20, including the UPSs 30, are fastened and torqued to a top side of the top horizontal surface of the skeletal framework 40.

Another embodiment provides that the rails of the skeletal framework 40 are separated by a gap close enough to provide mounting areas for the cabinet enclosures to mount to as well as close enough to give structural support to the entire integrated platform structure 10 when installed in place as the monolithic, pre-wired, pre-assembled integrated platform 10 by a crane at a construction site.

FIGS. 1 and 2 show both UPSs 30 mounted in a back to back arrangement and the series of electrical cabinets 20 connected side-by-side and mounted onto the structural frame 40 of the integrated platform 10. The series of cabinet enclosures 20 are close coupled side-by-side when mounted onto the skeletal framework 40 of the integrated platform 10. The switchgear cabinets mechanically and electrically interconnect via electrical bus bars through the sides of the cabinet enclosures 20 to form the switchgear cabinet, rather than connecting between the cabinet enclosures 20 with electrical conduits and wires routed underneath each cabinet enclosure 20. Note, some conduits and wires may be routed on or under the skeletal framework 40 but the bus bars are routed through the sides of the cabinet enclosures 20.

Figure 3A:
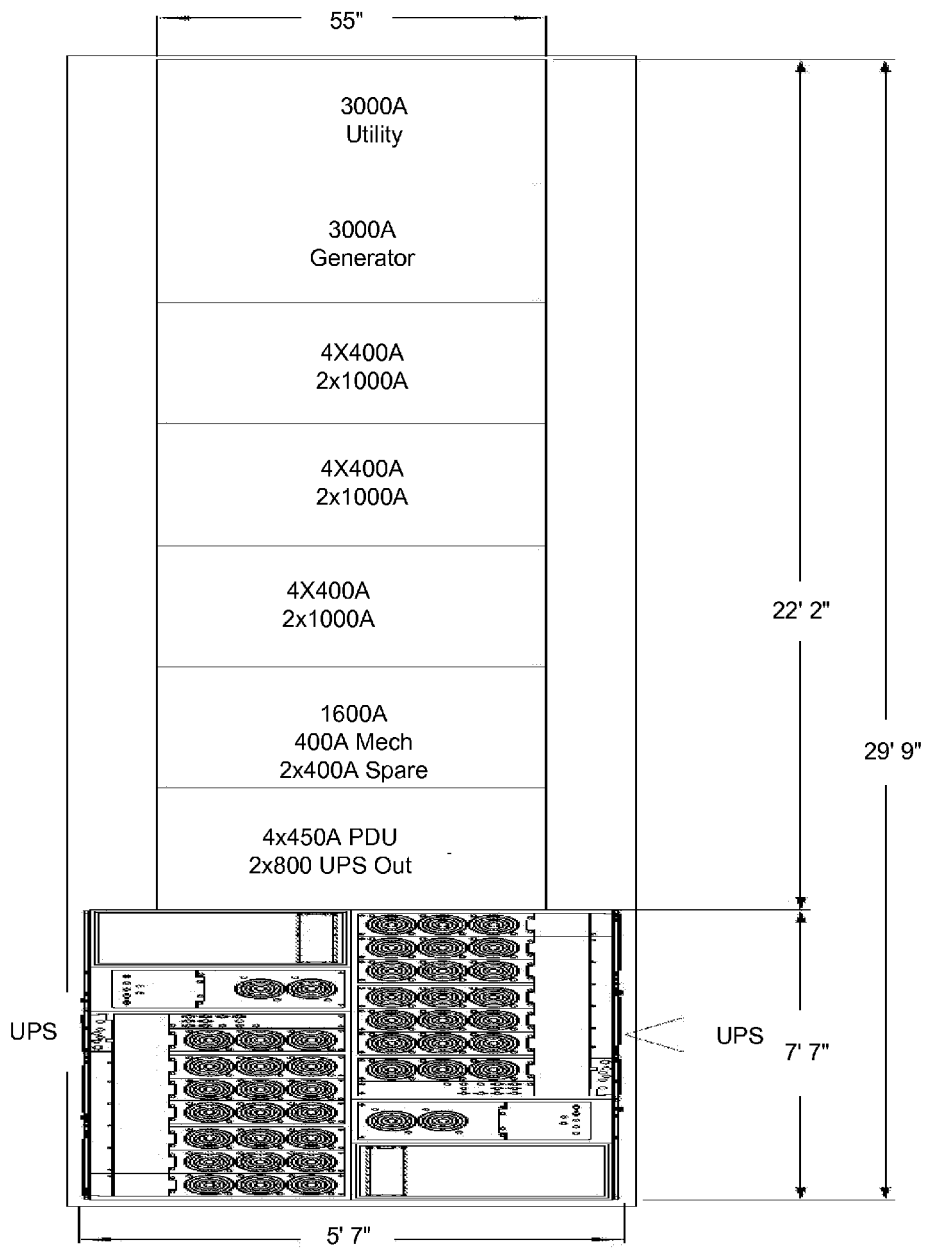
FIGS. 3A and 3B illustrate top down views of embodiments of the pre-wired and pre-engineered integrated platform where the series of electrical cabinets each contain circuit breakers within a given electrical amperage rating range.
Figure 3B:
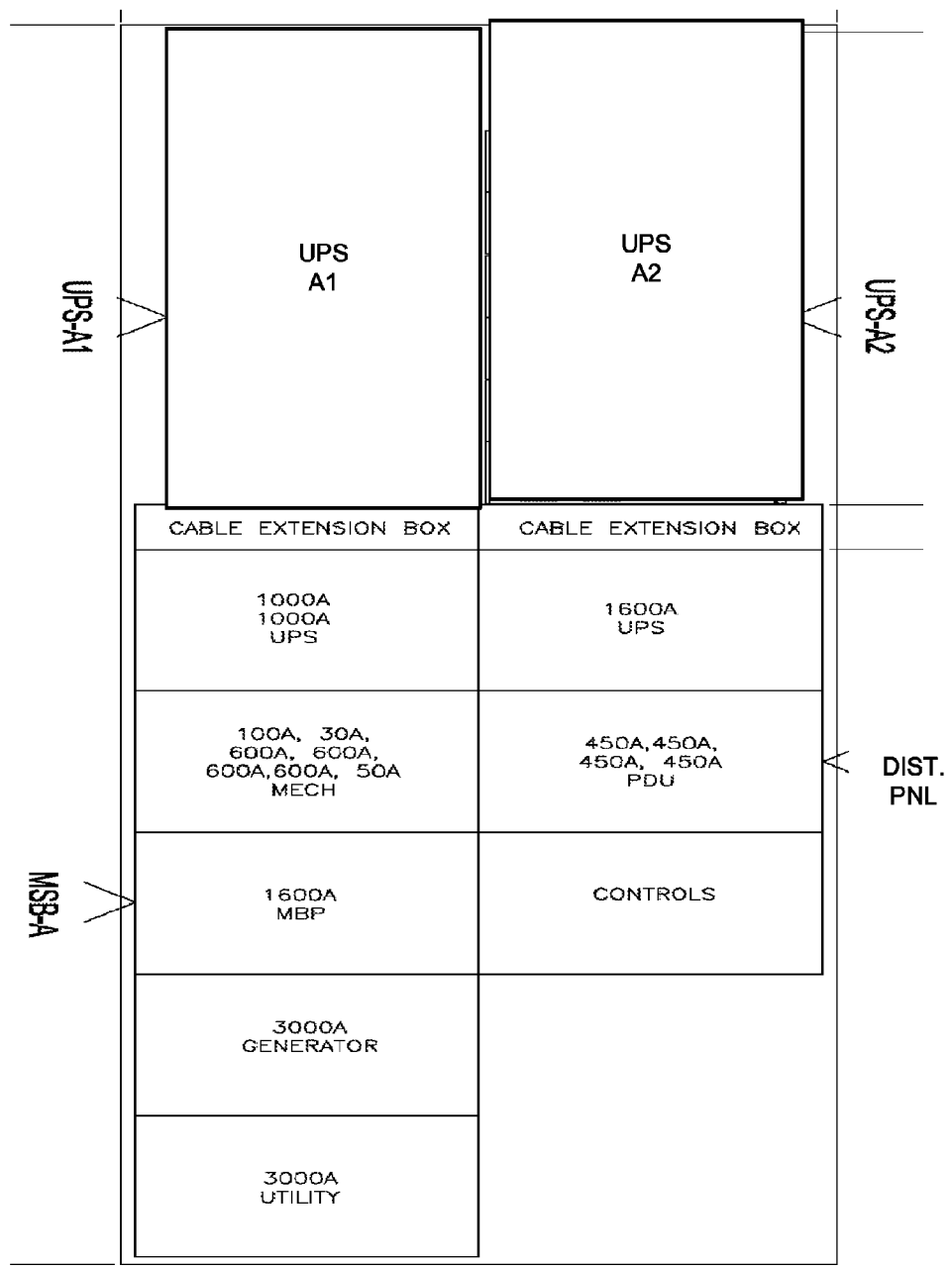

FIGS. 3A and 3B illustrate top down views of embodiments of the pre-wired and pre-engineered integrated platform 10 where the series of electrical cabinets 20 each contain circuit breakers within a given electrical amperage rating range. The electrical circuit breakers are separated by 1) amperage ratings, such as 1600 amp cabinets, 3000 amp utility or generator input cabinets, 450 amp PDUs, or 2) separated by functionality, into each of the seven electrical cabinets. The grouping by amperage or functionality provides significant advantages in costs and area needed.

To save area square footage, structurally, a standard silicon controlled rectifier (SCR)-based uninterruptable power supply 30 has been replaced with a transistor-based uninterruptable power supply 30. Intelligence is located in the uninterruptable power supply 30, not in a central control cabinet. Instead of having multiple dispersed switchgear sections, the present device has a combined seven-section lineup interconnected internally through the sides of the cabinet enclosures 20, rather than through conduit wires. As such, the present device also has a maintenance breaker internally, close coupled in the input and output cabinets, as opposed to below the conduit. Importantly, in an embodiment, a standard skid set was reduced from a minimum footprint of one 40'×12' skid to two 29'×8' skids. A reduced footprint allows for increased space, which may be used for a number of purposes, such as additional square footage available for leasing. The weight of the integrated platform including the mounted cabinet enclosures and the skeletal framework 40 is heavy enough by itself to be structurally sound and is not required to be anchored to either a construction foundation or to a building's foundation in non-seismic zones. Thus, the integrated platform 10 may be anchored or free-standing, depending on where it is located seismically. The integrated platform provides up to 1200 KW in critical power from the main and backup UPSs in a floor space footprint of less than 470 square feet, which results advantageously in more open space to lease in a datacenter. The size of the modules and weight of the integrated platform 10 is constrained by the need to ship skids over highways from the assembly facility to the job site. Typically, the shipping packages are not to exceed 50 feet by 12 feet and 100,000 pounds.

Integrated platform 10 would be packaged and delivered as a standardized system. The integrated platform 10 could be installed either internally or externally to the datacenter's brick-and-mortar shell structure.

Using a modular approach, the use of an integrated platform 10 allows for a smaller square footage and less construction time, resulting in savings in time and cost. Even though the size is dramatically reduced, more power is generated per square foot than with previous modular power centers because more capacity is configured into the aggregated uninterruptable power supplies 30.

In an embodiment, important improvements include providing a complete datacenter, critical-power distribution package on an integrated platform 10. The complete datacenter, critical-power distribution package provides more power (up to 1200 KW) in a smaller floor space footprint of approximately 464 square feet. The smaller the square foot floor space occupied by an electrical power distribution platform the better. This allows the datacenter building facility to have more available square footage to use for other purposes, such as leasing square footage space for computing equipment to clients. The multiple transistor-based uninterruptible power supplies 30 are used with intelligence included in the packaged framework. Close coupling the inputs and outputs allows a continuous switchgear lineup between input and output switchgear sections. The transistor-based uninterruptible power supply 30 electrically and mechanically connects into the series of electrical switch gear cabinets, all of which are mounted onto a steel-framed support structure. The one or more uninterruptible power supplies 30 electrically and physically mount in close proximity with the series of electrical switchgear cabinet enclosures 20. The grouping of a series of electrical switchgear cabinet breakers by amperes and functionality also has advantages. All of the components, including cabinet enclosures 20 and skeletal framework 40, are preassembled in an off-site manufacturing center. All of these components are mounted on a steel support frame that is pre-assembled in an offsite manufacturing center.

Two integrated platforms 10 in an arrangement may complement each other, providing 2N redundancy to the data hall. A second generator provides 2N generator redundancy. This second generator could be shared with additional data halls on the same campus as a swing generator. The redundancy of the generators would then be N+1. Each integrated platform 10 is outfitted with provisions to provide power for the entire mechanical system and all of the datacenter's lighting and computing electrical loads. Normally, power for one-half of the mechanical equipment is supplied by each integrated platform 10. In an embodiment, dedicated automated ATSs may automatically roll power to any active integrated platform 10 if power were lost.

Figure 4:
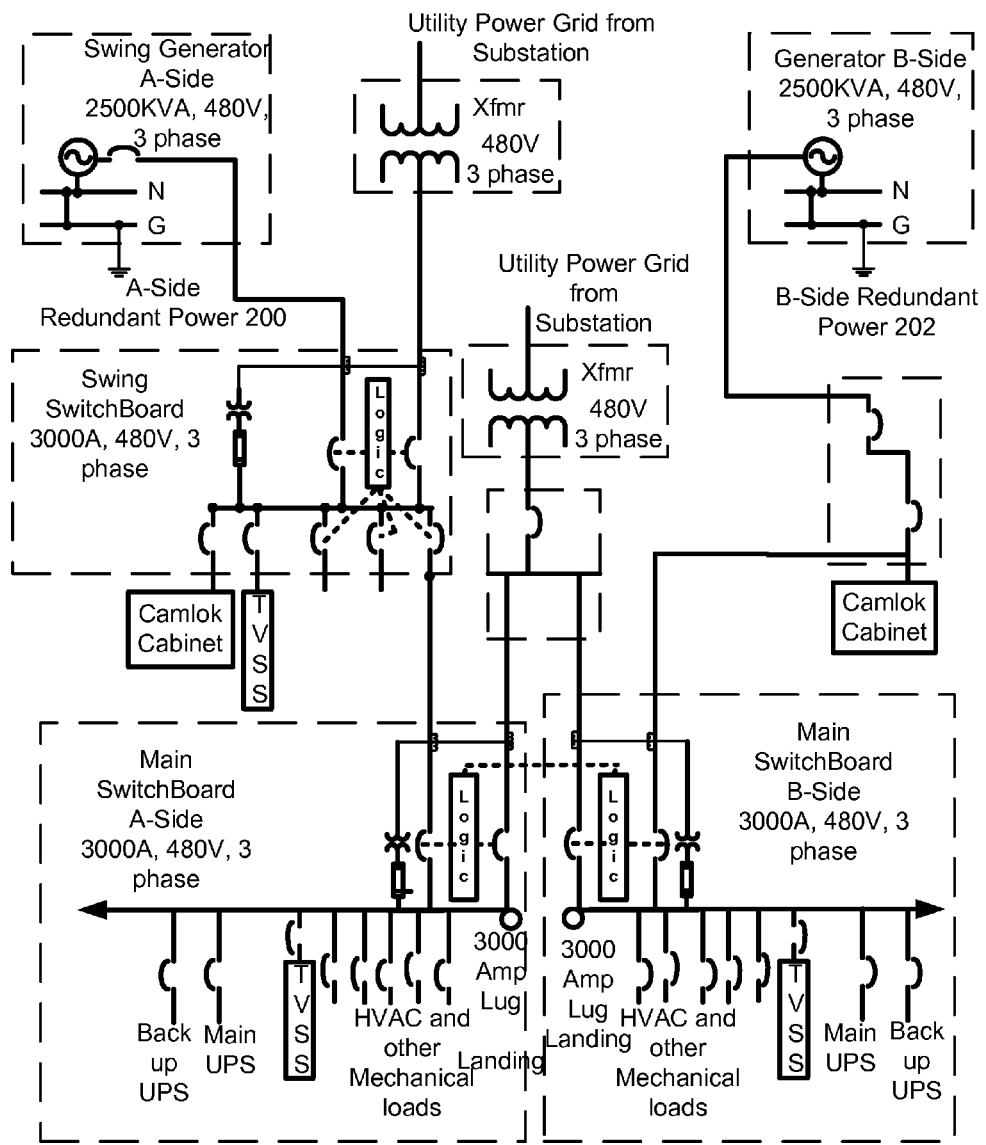
FIG. 4 illustrates a single line drawing of an embodiment of the pre-wired and pre-engineered integrated platform where power from a utility power grid comes in through a main step down transformer via one or more circuit breakers in a main switchboard cabinet to power mechanical cooling power loads for a datacenter and via additional circuit breakers to supply power through the main and backup UPSs.
Figure 5:
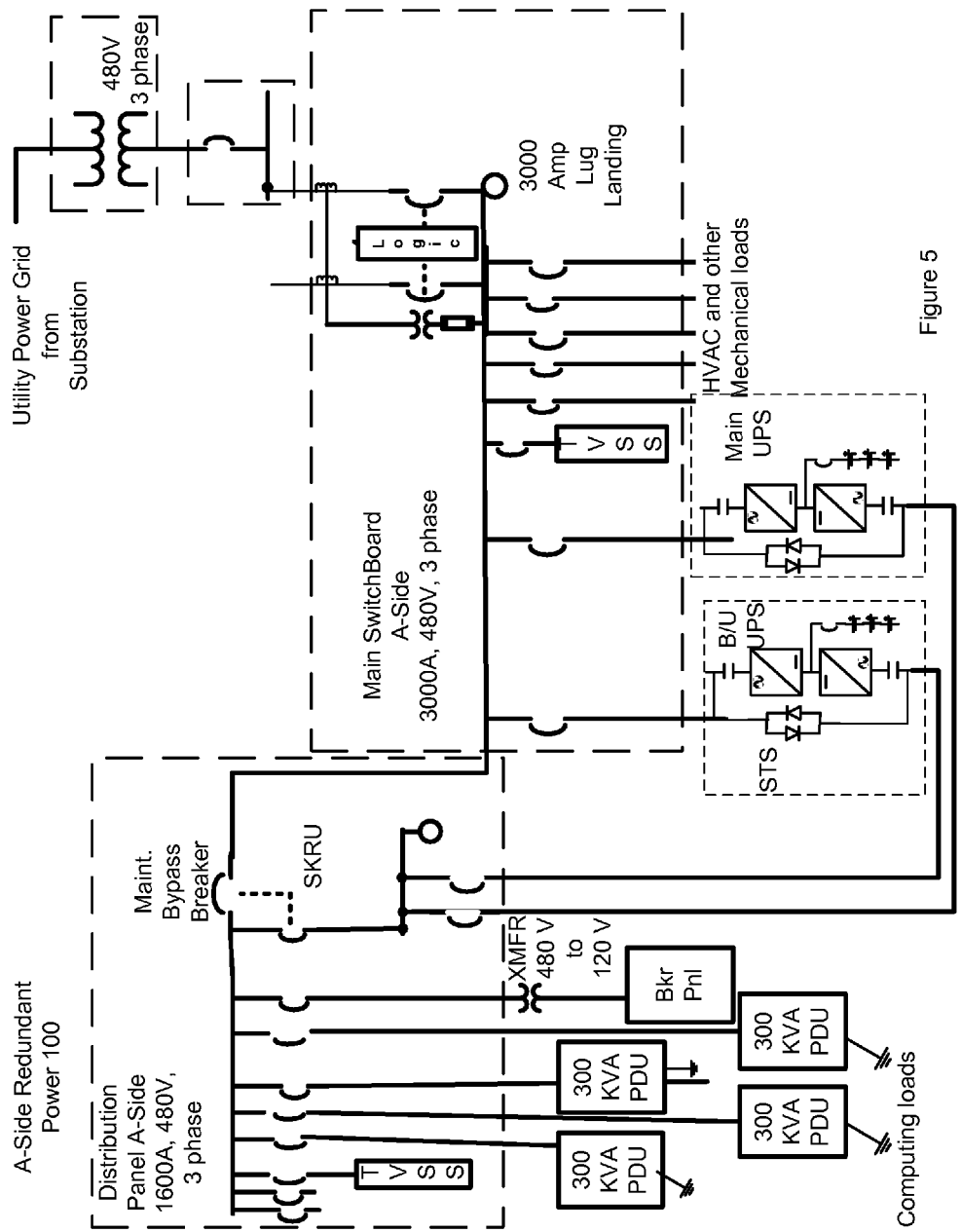
FIG. 5 illustrates a single line drawing of an embodiment of the pre-wired and pre-engineered integrated platform for A side redundant power where one of the cabinets contains circuit breakers for mechanical cooling power loads for a datacenter, and another cabinet contains circuit breakers for computing equipment loads for the datacenter.
Figure 6:
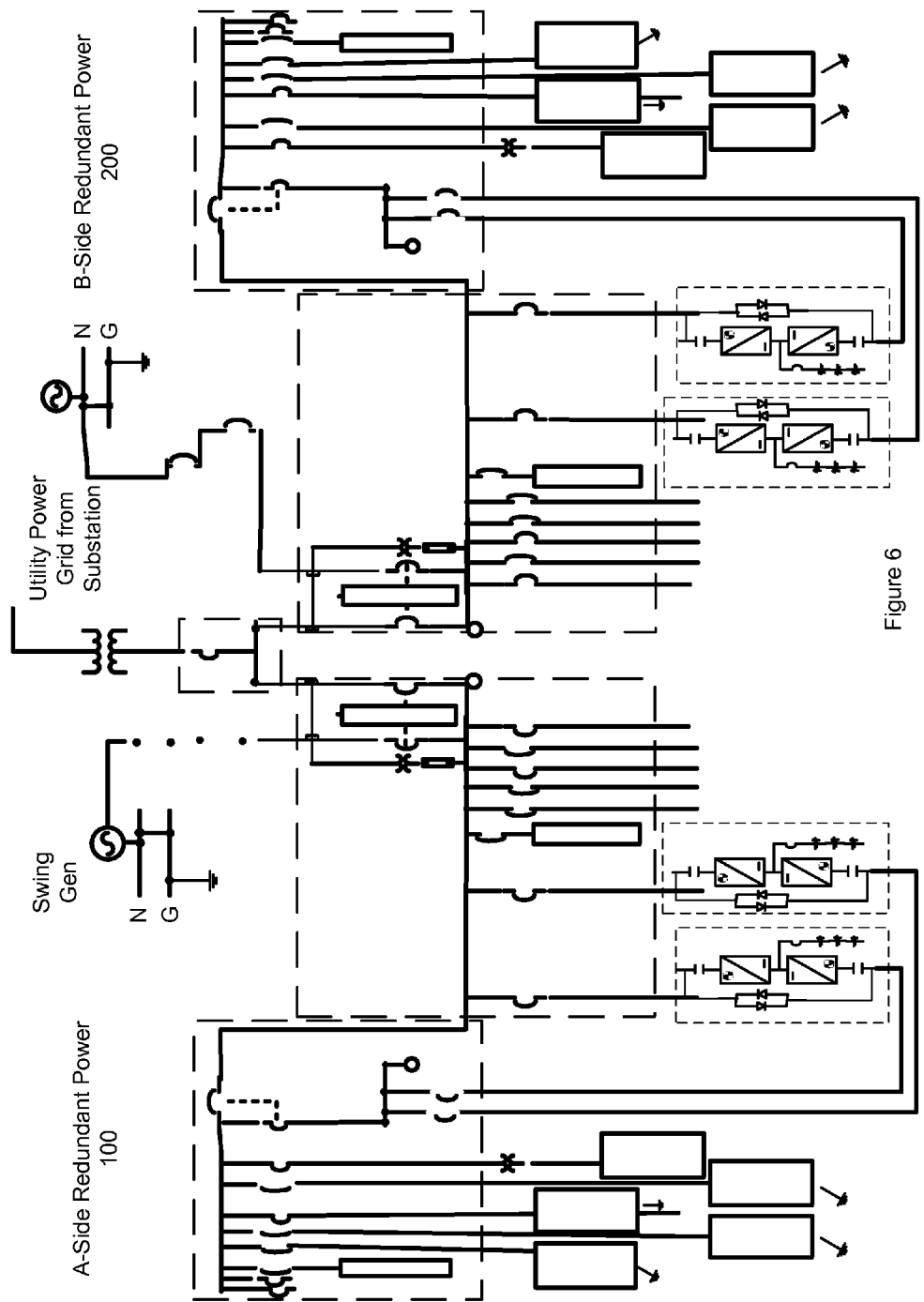
FIG. 6 illustrates a single line drawing of an embodiment of main and redundant power connected in the electrical distribution system of a datacenter, where the main power system and the redundant power system each contains its own instance of the UPSs and switch gear cabinets mounted on their integrated platform.

FIGS. 4-6 detail the separate sections and connections for the datacenter distribution package skids.

FIG. 4 illustrates a single line drawing of an embodiment of the pre-wired and pre-engineered integrated platform where power from a utility power grid comes in through a main step down transformer via one or more circuit breakers in a main switchboard cabinet to power mechanical cooling power loads for a datacenter and via additional circuit breakers to supply power through the main and backup UPS's.

Another cabinet on the skid has one or more electrical connections to the power cables of a backup AC power generator, one or more electrical connections to the signal controls to the backup AC power generator to start up the AC generator in an emergency and monitor its status, and one or more electrical connections to the power cables of a main AC power generator including a step down transformer connected to the power lines of the electrical power grid. The uninterruptible power supply 30 contains the control circuitry and software that controls a system static switch and a bypass control circuitry. The bypass control circuitry in the uninterruptible power supply 30 cabinet controls first and second electrically parallel breakers to connect the main uninterruptible power supply 30 via the first breaker to the power distribution center and to connect the backup uninterruptible power supply 30 via the second breaker to the power distribution center via the maintenance bypass breaker. The bypass control circuitry allows selection of the external AC power source directly to the power distribution center, thus bypassing the main and backup uninterruptible power supplies 30 while still supplying AC power to the power distribution center by electrically closing the maintenance bypass breaker and opening the first and second electrically parallel breakers.

The major electrical distribution system components may include one 2500-kilovolt-ampere (kVA) utility transformer, one primary 2500-kVA rated generator, one 2500-kVA/2000-kW standby generator, and a main and redundant power supply system for loads in the datacenter. The main and redundant power supply systems may each contain two or more electrical distribution cabinets including a 480-volts (V), 3000-amp (A) main distribution switchboard, two 1600-A UPS output distribution switchboards, as well as and two 1600-A maintenance bypasses, and two 1200-kW high-efficiency uninterruptible power supplies (UPS), two 1600-A static transfer switch (STS) by passes.

Each integrated platform 10 switchboard lineup includes a 3000-A and a 1600-A UL 891-listed switchboard. Each switchboard is equipped with two 3000-A, four 400-A, and four 450-A UL 489-listed circuit breakers. All circuit breakers larger than 200-A are 100% duty rated. The circuit breakers may include zone selective interlocks (ZSIs). A ZSI ties the circuit breaker trip units together, allowing them to communicate in order to ensure that the circuit breaker closest to the fault trips first. Increasing the fault isolation capabilities increases the datacenter's ability to maintain operational continuity.

A first generator and a second generator provide 2N generator redundancy. The second reserve/swing generator could be shared with additional data halls on the same campus. The redundancy of the generators would then be N+1.

A main switchboard cabinet on the integrated platform 10 has one or more electrical connections, including a first electrical connection and an associated circuit breaker to receive power cables coming from a main generator, acting as the backup AC power source, and a second electrical connection and associated circuit breaker coming from a step down transformer connected to power lines of the utility electrical power grid.

The power from the utility power grid comes in through a main step down transformer in the center of FIG. 4. Power from a utility power grid comes in through a main step down transformer via one or more circuit breakers in a main switchboard cabinet to power mechanical cooling power loads for a datacenter and via additional circuit breakers to supply power through the main and backup UPSs. The main and backup UPSs' supply critical power to computer equipment power distribution loads for the datacenter via further circuit breakers in the power distribution output panel.

High levels of arc-flash energy in the main switchboards became a concern when the decision was made to have the utility provide the main 2500-kVA transformer and the transformer's primary-side protection. Most utilities design their protection schemes to protect the utility's own equipment. This typically doesn't translate into limiting the arc-flash energy levels on the secondary side of these large transformers. Remoting the main utility breaker outside the integrated platform 10 allows the arc-flash energy to be contained inside the remote switchboard. The arc-flash energy can be significantly reduced and the arc-flash energy protection equipment is connected downstream of the main step down transformer.

A main switchboard cabinet of the two or more cabinet enclosures 20 contains a programmable logic controller to control fault tolerance operations on the integrated platform 10. The use of dual integrated platforms 10 facilitates the use of dual programmable logic controllers. The ability of the programmable logic controllers to stay in synchronous operation allows for a seamless transfer of control between either unit.

Each CPC has a dedicated programmable logic controller (PLC). The programmable logic controllers are hot swappable, so if either processor goes down, the other processor will automatically take control. The I/O rack is located in the A-CPC. There is no power bussing in the I/O section. The switchgear can be manually operated if the I/O rack is de-energized for maintenance. Protocol will be provided to the building management system at the programmable logic controller gateway for each main switchboard.

Each uninterruptible power supply 30 contains the control circuitry and software that controls a system static switch and a bypass control circuitry. The bypass control circuitry in the uninterruptible power supply 30 cabinet controls a first and a second electrically parallel breaker 1) to connect the main uninterruptible power supply via the first electrically parallel breaker to the electrical distribution system and 2) to connect the backup uninterruptible power supply via the second electrically parallel breaker to the electrical distribution system via a maintenance bypass breaker. The bypass control circuitry allows selection of an external AC power source directly to the electrical distribution system; thus bypassing the main and backup uninterruptible power supplies 30 while still supplying AC power to the electrical distribution system by electrically closing the maintenance bypass breaker and opening the first and the second electrically parallel breakers.

The main switchboards are configured as main-tie-main-tie-main. The main power has both a main and a backup uninterruptable power supply. The redundant power has both a main and a backup uninterruptable power supply. A main switchboard cabinet also includes one or more programmable logic controllers to control an operation of switches, including a first switch configured to select either 1) a main AC power source from a utility electrical power grid or 2) a backup AC power source to supply electrical power through the main and backup UPSs to loads in a datacenter. A second switch, when activated, isolates the main and backup UPSs to allow the main UPS to receive AC power from only the main or backup AC power source and similarly isolates the backup UPS to receive AC power from only the main or backup AC power source.

The sequence of operation of the total system is controlled automatically through deployment of redundant programmable logic controller control units installed in each of the 3000-A main switchboards. Should the primary standby generator fail to come online after loss of the utility source, the optional swing generator will pick up the critical loads of the system. Each generator may be provided with a weather-protective enclosure.

The main switchboard has lug landings in order to manually connect the main power side to the redundant power side. The main switchboard has integrated revenue-grade power-quality metering. One of the cabinet enclosures 20, such as the main switchboard, contains circuit breakers for mechanically cooling power loads for a datacenter and another cabinet enclosure 20 contains circuit breakers for computing equipment loads for the datacenter.

The circuit breakers in the cabinet enclosures 20 may have zone selective interlocks (ZSIs). The ZSIs tie the circuit breakers' trip units together, allowing them to communicate in order to ensure that a given circuit breaker closest to a fault trips. Increasing the fault isolation capabilities increases the datacenter's ability to maintain operational continuity. A logic controller is located in the first cabinet to govern the zone selective interlocks.

Each integrated platform 10 is outfitted with provisions to provide power for the entire mechanical system. Normally, power for one-half of the mechanical equipment is supplied by each integrated platform 10. Based on the equipment listed in the single line diagram, at least two integrated platforms 10 would be utilized in a datacenter.

FIG. 5 illustrates a single line drawing of an embodiment of the pre-wired and pre-engineered integrated platform for A-side redundant power where one of the cabinets contains circuit breakers for mechanically cooling power loads for a datacenter and another cabinet contains circuit breakers for computing equipment loads for the datacenter.

The two uninterruptible power supplies 30 connect via circuit breakers to the mainly mechanical cooling power loads for the datacenter on the right-hand side of the dotted lines. The two uninterruptible power supplies connect via circuit breakers to the mainly computer equipment power distribution loads for the datacenter on the left-hand side.

An embodiment provides a static switch included in a main uninterruptible power supply in the third cabinet enclosure and another static switch included in a backup uninterruptible power supply housed in a fourth cabinet enclosure. The main and backup UPS are electrically connected in parallel and the static switch is configured to ensure an instantaneous switchover from one UPS supply to the other in the event of a power failure of one of the UPSs. The power distribution output cabinet contains a maintenance bypass switch for power when both the main UPS and the backup UPS are electrically isolated from the electrical loads connected to the power distribution output cabinet.

The output of critical power from the uninterruptible power supplies 30 module is coupled to the power distribution output panel for datacenter loads, via at least a maintenance bypass breaker. A Solenoid Key Release Unit (SKRU) is configured to ensure that the main uninterruptible power supply has transferred to bypass before the maintenance bypass breaker can be engaged to the power distribution output panel. This will be a closed transition transfer so that critical load power will not be lost. Critical power to the IT load will be provided by eight 300-kVA PDUs installed in an alternating A/B arrangement in the data hall to provide 208/120-V power to either overhead busway or remote power panels. Each PDU has a 300-kVA K-13 rated transformer and six 225-A breakers. Additionally, each PDU has six integrated revenue-grade power-monitoring meters.

Another embodiment provides that the main UPS and the backup UPS are both transistor-based and have no transformer on their output. These transistor-based uninterruptible power supplies electrically and mechanically connect into the series of electrical switchgear cabinets, all of which are mounted onto the framework of the integrated platform.

Each integrated platform 10 switchboard lineup includes a 3000-A and a 1600-A UL 891-listed switchboard. Each switchboard is equipped with two 3000-A, four 400-A, and four 450-A UL 489-listed circuit breakers. All circuit breakers larger than 200-A are 100% duty rated. The circuit breakers may feature zone selective interlocks (ZSIs). A ZSI ties the circuit breaker trip units together, allowing them to communicate in order to ensure that the circuit breaker closest to the fault trips first. Increasing the fault isolation capabilities increases the datacenter's ability to maintain operational continuity.

The main switchboards are configured as main-tie-main-tie-main. Each CPC has a dedicated programmable logic controller (PLC). The programmable logic controllers are hot swappable, so if either processor goes down, the other processor will automatically take control.

The switchgear can be manually operated if the I/O rack is de-energized for maintenance. Protocol will be provided to the building management system at the programmable logic controller gateway for each main switchboard. The main switchgear has integrated revenue-grade power-quality metering.

Each side of the redundant power system features a 1.2-MW uninterruptible power supply 30. Each uninterruptible power supply 30 has a dedicated external 1600-A continuous-duty-rated static bypass switch. Power to the two uninterruptible power supply 30 systems is delivered from two separate A/B switchboards. Each switchboard is able to support the entire datacenter. The two tie breakers operate in the normally closed position. Power for the data hall will be derived from two identical integrated platform 10 modules, each of which is factory-assembled prior to on-site delivery.

Significant developments in the design process include the division of the electrical distribution system into two completely separate modular power centers, a second generator to provide N+1 redundancy, provisions for 'A side' and 'B side' mechanical feeders, integration of the main and output switchboards, integration of the maintenance bypass (MBP) breaker into the new contiguous switchboard lineup, introduction of dual-programmable logic controllers (PLCs), and introduction of a remote main utility circuit breaker.

FIG. 6 illustrates a single line drawing of an embodiment of main and redundant power connected in the electrical distribution system of a datacenter. The main power system and the redundant power system each contain their own instance of the UPSs and switch gear cabinets mounted on an integrated platform 10. The single line diagram in FIG. 6 shows two complete datacenter distribution package skids to supply A-side redundant power 100 and B-side redundant power 200. Each integrated platform 10 has its series of electrical cabinets with two uninterruptible power supplies 30. In general, each cabinet enclosure 20 that is part of one of the two integrated platforms 10 is indicated by dotted line. The main and swing generator and the grid step down transformer are in their own cabinet enclosures separate from the integrated platforms. The main A-side and redundant B-side power are connected in the electrical distribution system of the datacenter to support two sets of power supplied to each important or critical load. The main A-side power system includes the UPSs and switchgear cabinets mounted on the integrated platform 10. The redundant B-side power system includes the UPSs and switchgear cabinets mounted on another integrated platform 10. The integrated platforms 10 in this arrangement complement each other, providing 2N redundancy to the data hall's electrical computing loads and mechanical loads of the datacenter.

Figure 7A:
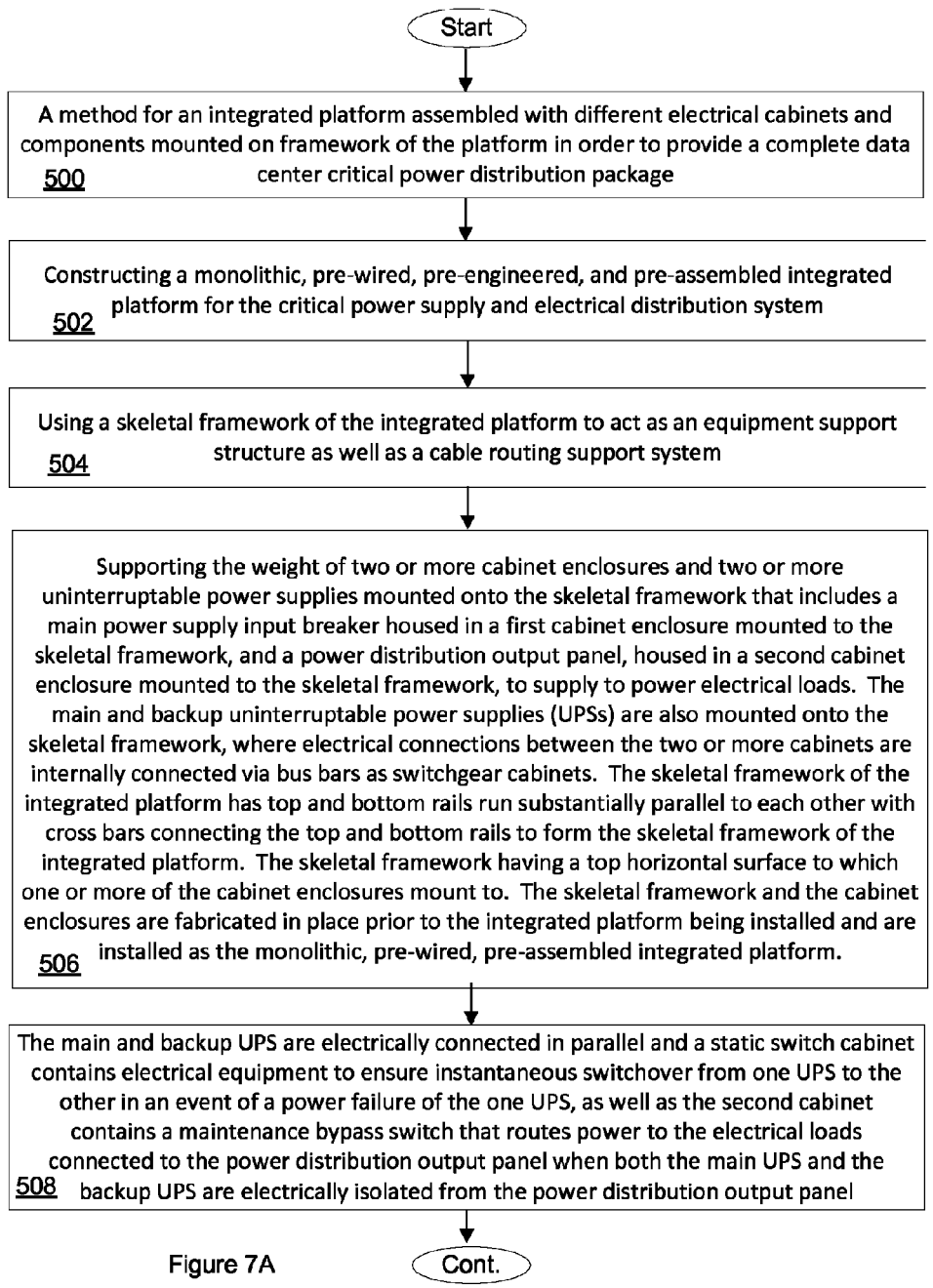
Figure 7B:
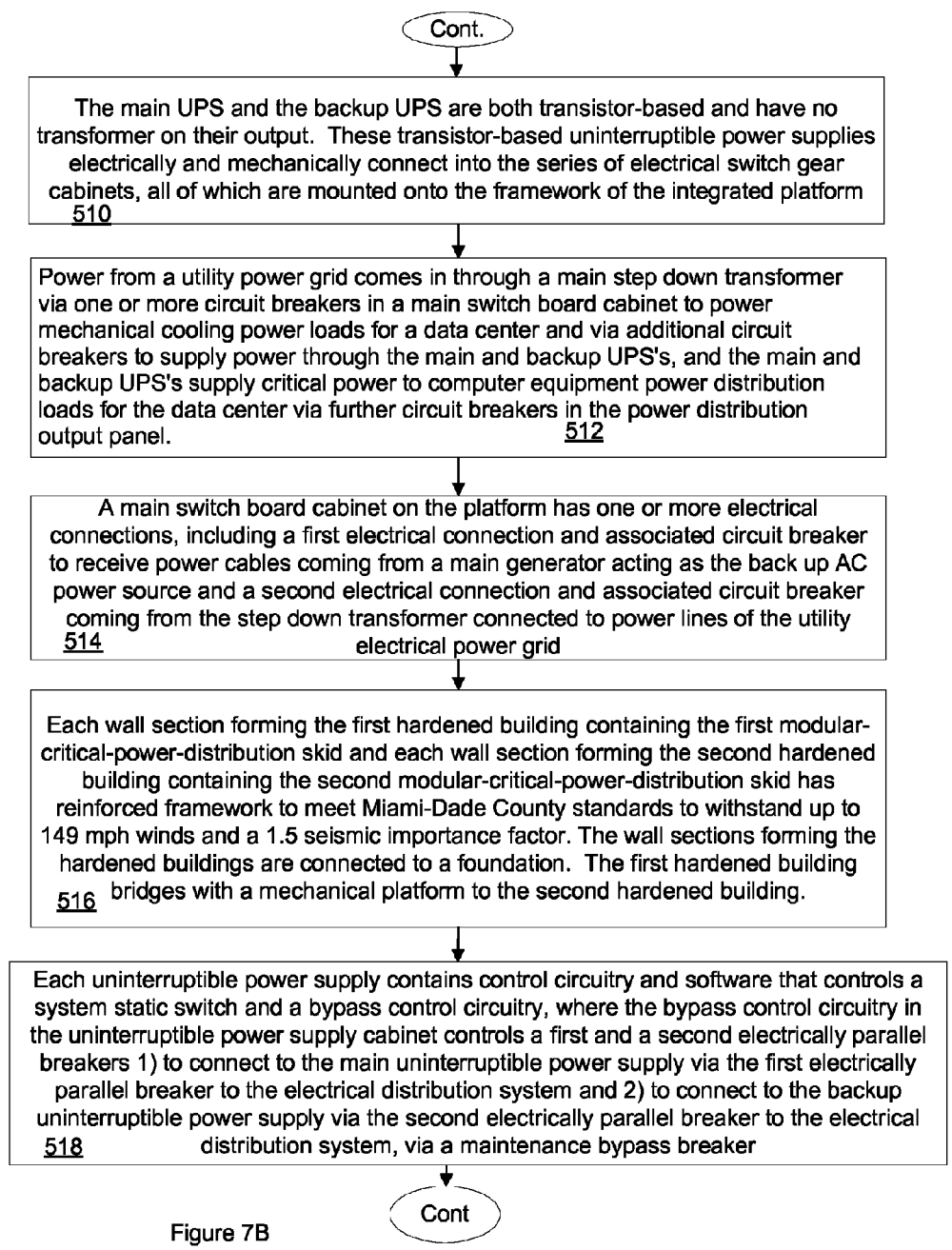

FIGS. 7A-C illustrate a flow diagram of an embodiment of constructing and operating an embodiment of an integrated platform assembled with different electrical cabinets and components mounted on the framework of the integrated platform in order to provide a complete datacenter critical-power distribution package. Steps 502-528 show an example embodiment, to which many variations and changes may be made as discussed herein. Also, the steps, where logically possible, may be performed out of the listed order.

The datacenter industry is beginning to realize the benefits of the early industrial revolution. Standardized modular power center designs provide some of the same benefits to design and construction personnel. Instead of hand-building custom electrical systems for each datacenter, the modular approach allows for greater deployment speed, improved quality and lower costs, all achieved by using factory-based labor. The use of modules also relieves labor stacking on the job site, while reducing the overall cost of the work by a significant amount. Cost savings can be attained using factory labor. Modularizing datacenter components permits control over cost, quality, and schedule.

In one embodiment, the software used to facilitate the algorithms discussed herein can be embodied onto a non-transitory machine-readable medium. A machine-readable medium includes any mechanism that stores information in a form readable by a machine (e.g., a computer). For example, a machine-readable medium includes read only memory (ROM); random access memory (RAM); magnetic disk storage media; optical storage media; flash memory devices; Digital VideoDisc (DVD's), EPROMs, EEPROMs, FLASH memory, magnetic or optical cards, or any type of media suitable for storing electronic instructions.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims.

What is claimed is:

1. A monolithic, pre-wired, pre-engineered, and pre-assembled integrated platform for a critical power supply and electrical distribution system that is pre-assembled, scalable, and modular, comprising:
   a skeletal framework of the integrated platform that acts as an equipment support structure as well as a cable routing support system;
   wherein the skeletal framework supports a weight of two or more cabinet enclosures and two or more uninterruptible power supplies (UPSs) mounted onto the skeletal framework that includes a main power supply input breaker housed in a first cabinet enclosure mounted to the skeletal framework, and a power distribution output panel, housed in a second cabinet enclosure mounted to the skeletal framework, to supply power to electrical loads, where main and backup power supply wiring is laid out and routed along the skeletal framework of the integrated platform to and between at least one of the two or more of the cabinet enclosures mounted onto the skeletal framework and the two or more UPSs mounted onto the skeletal framework, where electrical connections between the two or more cabinets are internally connected via bus bars as switchgear cabinets, wherein the skeletal framework of the integrated platform has top and bottom rails run substantially parallel to each other with cross bars connecting the top and bottom rails to form the skeletal framework of the integrated platform, the skeletal framework having a top horizontal surface to which one or more of the cabinet enclosures mount to, wherein the skeletal framework and the cabinet enclosures are fabricated in place prior to the integrated platform being installed as the monolithic, pre-wired, pre-assembled integrated platform.

2. The integrated platform of claim 1, further comprising: a static switch included in a main uninterruptible power supply (UPS) in a third cabinet enclosure, a backup uninterruptible power supply (UPS) housed in a fourth cabinet enclosure that is mounted back to back with the main uninterruptible power supply (UPS) in the third cabinet enclosure, and the main and backup UPS are electrically connected in parallel and a static switch cabinet contains electrical equipment to ensure instantaneous switchover from one UPS to the other in an event of a power failure of the one UPS, as well as the second cabinet contains a maintenance bypass switch for power when both the main UPS and the backup UPS are electrically isolated from the electrical loads connected to the power distribution output panel.

3. The integrated platform of claim 2, wherein the main UPS and the backup UPS are both transistor-based and have no transformer on their output, and these transistor-based uninterruptible power supplies electrically and mechanically connect into the series of electrical switch gear cabinets, all of which are mounted onto the framework of the integrated platform.

4. The integrated platform of claim 2, wherein the integrated platform provides up to 1200 KW in critical power from the main and backup UPSs in a floor space footprint of less than 470 square feet, which results in open space to lease in a datacenter, and the series of electrical cabinets each contain circuit breakers within a given electrical amperage rating range; and thus, many circuit breakers of similar average electrical amperage ratings are contained within the same cabinet and a neighboring cabinet has circuit breakers of a different range of electrical amperage.

5. The integrated platform of claim 2, wherein the rails of the skeletal framework are separated by a gap close enough to provide mounting areas for the cabinet enclosures to mount to as well as close enough to give structural support to the entire integrated platform structure when installed in place as the monolithic, pre-wired, pre-assembled integrated platform by a crane at a construction site, where main and redundant power are connected in the electrical distribution system of a datacenter, the main power system contains the UPSs and switch gear cabinets mounted on the integrated platform, and power from a utility power grid comes in through a main step down transformer via one or more circuit breakers in a main switchboard cabinet to power mechanical cooling power loads for the datacenter and via additional circuit breakers to supply power through the main and backup UPS's, and the main and backup UPS's supply critical power to computer equipment power distribution loads for the datacenter via further circuit breakers in the power distribution output panel.

6. The integrated platform of claim 5, where lug landings exist in the main switchboard cabinet in order to manually connect a main power side to a redundant power side.

7. The integrated platform of claim 2, wherein a main switchboard cabinet further comprises:
one or more programmable logic controllers to control an operation of switches, including
a first switch configured to select either 1) a main AC power source from a utility electrical power grid or 2) a backup AC power source, to supply electrical power through the main and backup UPSs to loads in a datacenter, and
a second switch configured that when activated isolates the main and backup UPSs to allow the main UPS to receive AC power from only the main or backup AC power source and similarly isolates the backup UPS to receive AC power from only the main or backup AC power source.

8. The integrated platform of claim 7, wherein the main switchboard cabinet on the platform has one or more electrical connections, including a first electrical connection and associated circuit breaker to receive power cables coming from a main generator acting as the backup AC power source and a second electrical connection and associated circuit breaker coming from a step down transformer connected to power lines of the utility electrical power grid.

9. The integrated platform of claim 2, where each uninterruptible power supply contains control circuitry and software that controls a system static switch and a bypass control circuitry, where the bypass control circuitry in the uninterruptible power supply cabinets control a first and a second electrically parallel breakers 1) to connect to the main uninterruptible power supply via the first electrically parallel breaker to the electrical distribution system and 2) to connect to the backup uninterruptible power supply via the second electrically parallel breaker to the electrical distribution system, via the maintenance bypass switch, and where the bypass control circuitry allows selection of an external AC power source directly to the electrical distribution system; and thus, bypassing the main and backup uninterruptible power supplies while still supplying AC power to the electrical distribution system via electrically closing the maintenance bypass breaker and opening the first and the second electrically parallel breakers.

10. The integrated platform of claim 1, where one of the cabinets contains circuit breakers for mechanical cooling power loads for a datacenter, and another cabinet contains circuit breakers for computing equipment loads for the datacenter.

11. The integrated platform of claim 10, where the circuit breakers in the cabinets have zone selective interlocks (ZSIs), where the ZSIs tie the circuit breaker's trip units together, allowing them to communicate in order to ensure that a given circuit breaker closest to a fault trips first, and a logic controller located in the first cabinet is configured to govern the zone selective interlocks.

12. The integrated platform of claim 1, wherein a weight of the integrated platform including the mounted cabinet enclosures and the skeletal framework is heavy enough by itself to be structurally sound and not require to be anchored to either a construction foundation or to a building's foundation in non-seismic zones, and the switchgear cabinets mechanically and electrically interconnect via the electrical bus bars through the sides of the cabinets to form the switchgear cabinets rather than connecting between the cabinets with electrical conduits and wires routed underneath each cabinet.

13. The integrated platform of claim 2, where an output of critical power from the uninterruptible power supplies is coupled to the power distribution output panel for datacenter loads, via at least a maintenance bypass breaker, where a Solenoid Key Release Unit is configured to ensure that the main uninterruptible power supply has transferred to bypass before the maintenance bypass breaker can be engaged to the power distribution output panel.

14. The integrated platform of claim 1, where a main switchboard cabinet of the two or more cabinets contains a programmable logic controller to control fault tolerance operations on the integrated platform.

15. A method for an integrated platform assembled with different electrical cabinets and components mounted on framework of the platform in order to provide a complete datacenter critical power distribution package, comprising:
constructing a monolithic, pre-wired, pre-engineered, and pre-assembled integrated platform for a critical power supply and electrical distribution system;
using a skeletal framework of the integrated platform to act as an equipment support structure as well as a cable routing support system;
supporting a weight of two or more cabinet enclosures and two or more uninterruptable power supplies (UPSs) mounted onto the skeletal framework that includes a main power supply input breaker housed in a first cabinet enclosure mounted to the skeletal framework, and a power distribution output panel, housed in a second cabinet enclosure mounted to the skeletal framework, to supply power to electrical loads, where a main and backup UPSs are also mounted onto the skeletal framework, where electrical connections between the two or more cabinets are internally connected via bus bars as switchgear cabinets, wherein the skeletal framework of the integrated platform has top and bottom rails run substantially parallel to each other with cross bars connecting the top and bottom rails to form the skeletal framework of the integrated platform, the skeletal framework having a top horizontal surface to which one or more of the cabinet enclosures mount to, wherein the skeletal framework and the cabinet enclosures are fabricated in place prior to the integrated platform being installed as the monolithic, pre-wired, pre-assembled integrated platform; and
where the main and backup UPSs are electrically connected in parallel and a static switch cabinet contains electrical equipment to ensure instantaneous switchover from one UPS to the other in an event of a power failure of the one UPS, as well as the second cabinet contains a maintenance bypass switch that routes power to electrical loads connected to the power distribution output panel when both the main UPS and the backup UPS are electrically isolated from the power distribution output panel.

16. The method of claim 15, wherein the main UPS and the backup UPS are both transistor-based and have no transformer on their output, and these transistor-based uninterruptible power supplies electrically and mechanically connect into the series of electrical switch gear cabinets, all of which are mounted onto the framework of the integrated platform.

17. The method of claim 15, wherein power from a utility power grid comes in through a main step down transformer via one or more circuit breakers in a main switchboard cabinet to power mechanical cooling power loads for the datacenter and via additional circuit breakers to supply power through the main and backup UPS's, and the main and backup UPS's supply critical power to computer equipment power distribution loads for the datacenter via further circuit breakers in the power distribution output panel.

18. The method of claim 17, wherein the main switchboard cabinet on the platform has one or more electrical connections, including a first electrical connection and associated circuit breaker to receive power cables coming from a main generator acting as the backup AC power source and a second electrical connection and associated circuit breaker coming from the step down transformer connected to power lines of the utility electrical power grid.

19. The method of claim 18, wherein each uninterruptible power supply contains control circuitry and software that controls the static switch and a bypass control circuitry, where the bypass control circuitry in the uninterruptible power supply cabinets controls a first and a second electrically parallel breakers 1) to connect to the main uninterruptible power supply via the first electrically parallel breaker to the electrical distribution system and 2) to connect to the backup uninterruptible power supply via the second electrically parallel breaker to the electrical distribution system, via a maintenance bypass breaker, and where the bypass control circuitry allows selection of an external AC power source directly to the electrical distribution system; and thus, bypassing the main and backup uninterruptible power supplies while still supplying AC power to the electrical distribution system via electrically closing the maintenance bypass breaker and opening the first and the second electrically parallel breakers.

20. The method of claim 17, wherein an output of the critical power from the uninterruptible power supplies is coupled to the power distribution output panel for datacenter loads, via at least the maintenance bypass breaker, where a Solenoid Key Release Unit is configured to ensure that the main uninterruptible power supply has transferred to bypass before the maintenance bypass breaker can be engaged to the power distribution output panel.

* * * * *